United States Patent [19]

Imai

[11] Patent Number: 5,483,056
[45] Date of Patent: Jan. 9, 1996

[54] METHOD OF PROJECTING EXPOSURE WITH A FOCUS DETECTION MECHANISM FOR DETECTING FIRST AND SECOND AMOUNTS OF DEFOCUS

[75] Inventor: Yuji Imai, Ohmiya, Japan

[73] Assignee: Nikon Corporation, Tokyo, Japan

[21] Appl. No.: 319,634

[22] Filed: Oct. 7, 1994

[30] Foreign Application Priority Data

Oct. 12, 1993 [JP] Japan .................................. 5-254019

[51] Int. Cl.$^6$ .................................................. G01J 1/20
[52] U.S. Cl. ........................ 250/201.4; 355/55; 250/548
[58] Field of Search ........................... 250/201.4, 201.2, 250/201.5, 548; 355/55, 53, 54, 56; 356/379–401

[56] References Cited

U.S. PATENT DOCUMENTS

| | | | |
|---|---|---|---|
| 4,677,301 | 6/1987 | Tanimoto et al. ................... | 250/548 |
| 4,866,262 | 9/1989 | Van der Werf et al. ............ | 250/201.4 |
| 5,408,083 | 4/1995 | Hirukawa et al. ................... | 250/201.2 |

*Primary Examiner*—Edward P. Westin
*Assistant Examiner*—Que T. Le

[57] ABSTRACT

A method of projection exposure of a shot area on a substrate to a mask pattern by detecting, by a focus detection mechanism, an amount of defocus, in the axial direction of a projection optical system, of a measuring point on the substrate with reference to the focal plane of the projection optical system, then loading the substrate, and moving the substrate to a predetermined height by a Z-stage movable in the axial direction of the projection optical system, based on the value detected by the focus detection mechanism; thereby exposing a shot area of the substrate to the mask pattern.

39 Claims, 6 Drawing Sheets

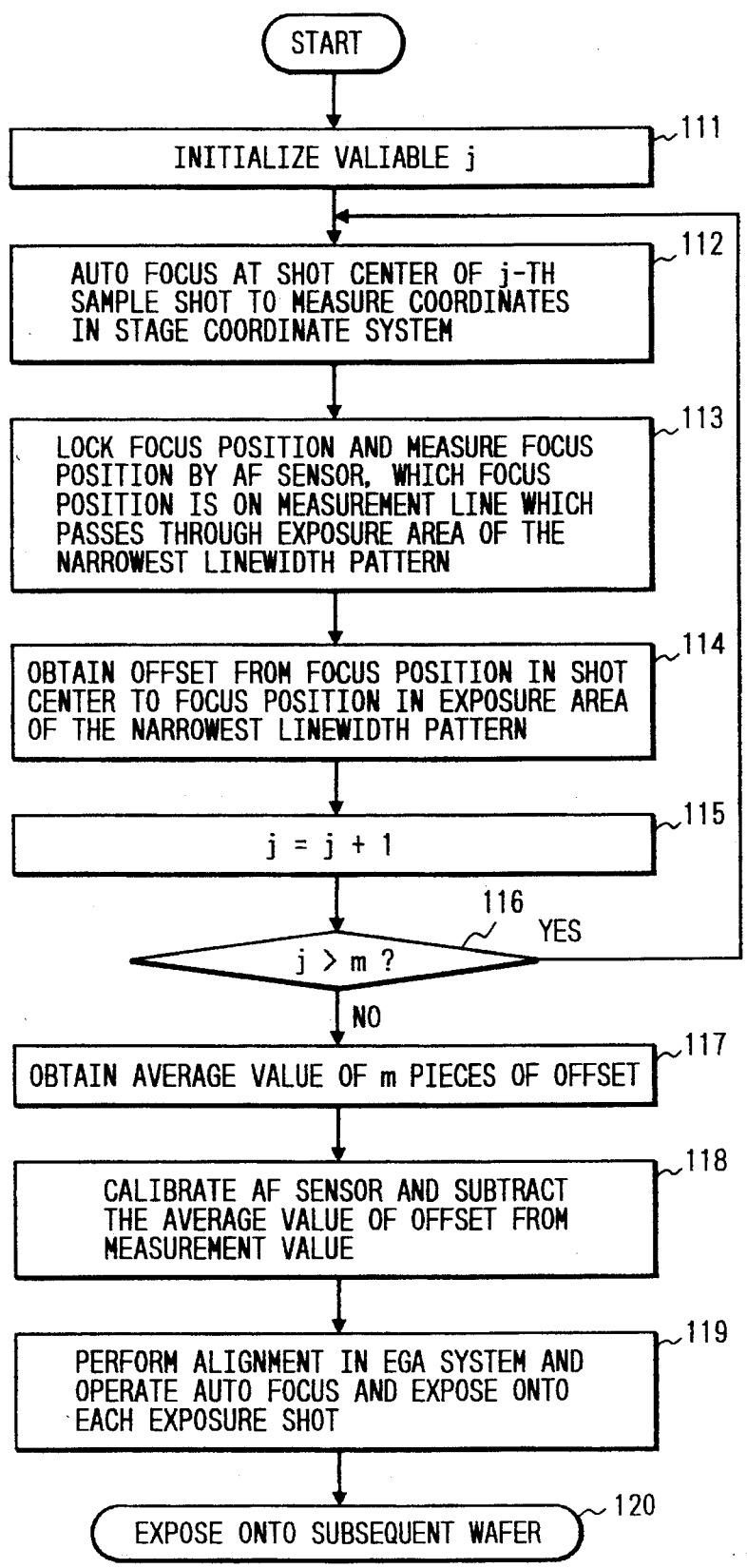

METHOD OF PROJECTING EXPOSURE WITH A FOCUS DETECTION MECHANISM FOR DETECTING FIRST AND SECOND AMOUNTS OF DEFOCUS

BACKGROUND OF THE INVENTION

1. Field of the Invention

The present invention relates to a method of exposure adapted for use, for example in the manufacture of a semiconductor device, in projection exposure of a mask pattern on a photosensitive substrate.

2. Related Background Art

In the manufacture of a semiconductor device, a liquid crystal display device or the like by a photolithographic process, there is employed a projection exposure apparatus for projecting the image of the pattern of a photomask or a reticle (hereinafter collectively called reticle) through a projection optical system onto each of the shot areas on a wafer (or a glass plate) coated with photosensitive material. For such projection exposure, there is recently employed the exposure apparatus of step-and-repeat method, particularly the exposure apparatus of reduced projection, or stepper. In such apparatus the wafer is placed on a two-dimensionally movable stage, and is stepped by said stage whereby the shot areas on the wafer are exposed in succession to the image of the pattern on the reticle.

In such projection exposure apparatus, there is generally employed a projection optical system of a high numerical aperture because of the requirement for a high resolving power, so that the depth of focus of the projected image obtained by the projection optical system becomes smaller in reciprocal proportion to the square of the numerical aperture. Therefore, in order to position each shot area of the wafer within the depth of focus with respect to the focal plane of the projection optical system, the projection exposure apparatus is conventionally equipped with the following auto focusing mechanism. Said mechanism is composed of a focus position detecting sensor for detecting the amount of difference between the focus position (corresponding to the axial position of the projection optical system) at a predetermined measuring point in each shot area on the wafer and the focal plane of the projection optical system (said sensor being hereinafter called AF sensor), and a servo system for maintaining said amount of difference within a tolerance range.

In such projection exposure apparatus, the exposure is conducted in the following steps of (1) positioning a predetermined shot area on the wafer at the position of exposure, (2) focusing, for example, the center of the shot area (shot center) to the focal plane by the servo system, utilizing the result of detection by the AF sensor, and (3) exposing the shot area to the image of the reticle pattern.

Consequently, the auto focusing mechanism has been designed to focus, for example, the shot center of each shot area to the focal plane.

In the above-explained prior art, the area to be focused by the auto focusing mechanism is fixed in each shot area. For this reason, the area requiring most exact focusing in each shot area may be positioned outside the depth of focus of the focal plane of the projection optical system. For example, if the reticle pattern contains circuit patterns of different line widths, the area requiring most exact focusing within each shot area on the wafer is the area where the image of circuit pattern of the narrowest line width is projected. Such area, however, may be different from the area focused by the auto focusing mechanism, for example the shot center.

Also with the recent progress in the level of integration of the semiconductor device, the wafer in the device manufacturing process tends to include significant step differences instead of being flat. For this reason, if the relative positional relationship between the optical axis of the AF sensor and that of the projection optical system is different among plural projection exposure apparatus, there is encountered a drawback that the focal position becomes different from apparatus to apparatus.

SUMMARY OF THE INVENTION

In consideration of the foregoing, the object of the present invention is to provide a method of exposure allowing to focus an area, requiring most exact focusing within the shot area to be exposed on the wafer, to the focal plane of the projection optical system.

A first exposure method of the present invention is composed of a 1st step of moving the substrate stage within a plane perpendicular to the optical axis of the projection optical system thereby setting a shot area of said substrate at an exposure position within the exposure field of said projection optical system; a 2nd step of determining, by focus detection means, a 1st amount of defocus which is the amount of difference, in the axial direction of said projection optical system, between the focal plane of said projection optical system and the exposed surface of said substrate; a 3rd step of determining, by the focus detection means, a 2nd amount of defocus which is the amount of difference, in the axial direction of said projection optical system, between the surface of an area where the projected image of the mask pattern has the narrowest line width within the shot area and the focal plane of said projection optical system; a 4th step of determining an offset amount which is the difference between said first and second amounts of defocus; a 5th step of displacing the substrate by moving said substrate stage in the axial direction, based on a value obtained by correcting said focus detection means with said offset amount; and a 6th step of exposing the substrate to the projected image of the mask pattern.

Also the amount of defocus may be detected in the following manner, by a step of detecting the distribution of the amount of defocus by the focus detection means, by relatively moving the substrate and the measuring point of the focus detection means by a scanning motion of the substrate stage in a plane perpendicular to the optical axis of the projection optical system, and a step of determining the 2nd amount of defocus corresponding to the surface of an area where the projected image of the mask pattern has the narrowest line width, from the above-mentioned distribution of the amount of defocus.

Also the 2nd amount of defocus may be determined, instead of the area where the projected image of the mask pattern has the narrowest line width, in an area selected by a blind which serves to limit the projected mask pattern.

Also according to the present invention a second exposure method may be conducted in the following manner by a 1st step of moving the substrate stage within a plane perpendicular to the optical axis of the projection optical system thereby setting one of sample areas of a certain number, preselected from the plural shot areas on the substrate, at an exposure position within the exposure field of the projection optical system; a 2nd step of determining, by the focus detection means, a 1st amount of defocus which is the amount of difference, in the axial direction of the projection optical system, between the focal plane of said projection optical system and the exposed surface of said sample area; a 3rd step of determining, by said focus detection means, a 2nd amount of defocus which is the amount of difference, in the axial direction of said projection optical system, between the surface of an area where the projected image of the pattern has the narrowest line width within said shot area and the focal plane of the projection optical system; a 4th step of determining the 1st and 2nd amounts of defocus in all samples areas by repeating the 1st to 3rd steps; a 5th step of determining an offset amount, which is the difference between the 1st and 2nd amounts of defocus, in all said sample areas and determining the averaged offset amount over all said sample areas; a 6th step of moving said substrate stage thereby setting a shot area at an exposure position within the exposure field of said projection optical system; a 7th step of determining a 3rd amount of defocus which is the amount of difference, in the axial direction of the projection optical system, between the focal plane of said projection optical system and the exposed surface of the substrate; an 8th step of displacing the substrate by moving the substrate stage in the axial direction, based on a value obtained by correcting said 3rd amount of defocus with said averaged offset amount; and a 9th step of exposing the substrate to the projected image of the mask pattern.

Also in this second exposure method, there may be instead employed a step of detecting the distribution of the amount of defocus by the focus detection means, by relatively moving the substrate and the measuring point of the focus detection means by a scanning motion of the substrate stage within a plane perpendicular to the optical axis of the projection optical system, and a step of determining the 2nd amount of defocus corresponding to the surface of an area where the projected image of the mask pattern has the narrowest line width, from the above-mentioned distribution of the amount of defocus.

Also the 2nd amount of defocus may determined, instead of the area where the projected image of the mask pattern has the narrowest line width, in an area selected by a blind which serves to limit the projected mask pattern.

The second exposure method further includes, in the 2nd step, further detecting the amounts of defocus at the four corners of plural sample areas by the focus detection means; in the 5th step, further determining an averaged angle of inclination from the focal plane of the projection optical system, based on the amounts of defocus at the four corners of plural sample areas; and, in the 6th step, correcting the inclination based on the averaged angle of inclination.

Further according to the present invention, a third exposure method can be conducted in the following manner, by a 1st step of moving the substrate stage within a plane perpendicular to the optical axis of the projection optical system thereby setting one of sample areas of a certain number, preselected from the plural shot areas on the substrate, at an exposure position within the exposure field of the projection optical system; a 2nd step of determining, by the focus detection means, a 1st amount of defocus which is the amount of difference, in the axial direction of the projection optical system, between the focal plane of said projection optical system and the exposed surface of the substrate, and also detecting the coordinate, in the coordinate system of said substrate stage, of the sample area set at said exposure position; a 3rd step of determining, by said focus detection means, a 2nd amount of defocus which is the amount of difference, in the axial direction of said projection optical system, between an area where the projected image of the pattern has the narrowest line width within said shot area and the focal plane of said projection optical system, within the sample area set at said exposure position; a 4th step of determining the 1st and 2nd amounts of defocus in all said samples areas and also detecting the coordinate, in the coordinate system of said substrate stage, of the sample area set at said exposure position, by repeating the 1st to 3rd steps; a 5th step of determining the amounts of offset which are the differences between the 1st and second amounts of defocus in all said sample areas thereby obtaining an averaged value of the offset amounts in all said sample areas, and statistically processing the coordinates, detected in the 4th step in the coordinate system of said substrate stage, of all said sample areas thereby obtaining the coordinates of arrangement of said plural shot areas; a 6th step of moving said substrate stage thereby setting a shot area on the substrate, based on the coordinates of arrangement determined in the 5th step, at an exposure position within the exposure field of said projection optical system; a 7th step of determining a 3rd amount of defocus which is the amount of difference, in the axial direction of the projection optical system, between the focal plane of the projection optical system and the exposed surface of the substrate; an 8th step of displacing the substrate by moving the substrate stage in the axial direction, based on a value obtained by correcting the 3rd amount of defocus with said averaged offset amount; and a 9th step of exposing the substrate to the projected image of the mask pattern.

Also in this third exposure method, there may be instead employed a step of detecting the distribution of the amount os defocus by the focus detection means, by relatively moving the substrate and the measuring point of the focus detection means by a scanning motion of the substrate stage in a plane perpendicular to the optical axis of the projection optical system, and a step of determining the 2nd amount of defocus corresponding to the surface of an area where the projected image of the mask pattern has the narrowest line width, from the above-mentioned distribution of the amount of defocus.

The third exposure method further includes, in the 2nd step, further detecting the amounts of defocus at four corners of plural sample areas by the focus detection means; in the 5th step, further determining the averaged angle of inclination from the focal plane of the projection optical system, based on the amounts of defocus at the four corners of plural sample areas; and, in the 6th step, correcting the inclination based on the averaged angle of inclination.

In the first exposure method, the most exact focusing is required, within the shot area to be exposed on the substrate, in the area where the projected image of the mask pattern has the narrowest line width. According to said method, the amount of defocus is measured on a measuring line passing on said area, then there is determined the offset from the amount of defocus at measuring point of the focus detection means within the shot area, and the height of the substrate is selected with correction by said offset at the exposure of the shot area to the projected image of the mask pattern, so that the above-mentioned area can be most exactly focused to the focal plane of the projection optical system.

In the second exposure method, the most exact focusing is required, within the shot area to be exposed on the substrate, in the area where the projected image, selected by a blind, of the mask pattern is projected. According to this exposure method, as in the first exposure method, the above-mentioned area can be most exactly focused to the focal plane of the projection optical system.

The third exposure method is the application of the first exposure method to a case of alignment with so-called enhanced global alignment method (hereinafter expressed as EGA) as disclosed in the U.S. Pat. No. 4,780,619. In such EGA method, the coordinates, in the coordinate system of the substrate stage, are measured only on the sample areas selected from all the shot areas to be exposed on the substrate, then the coordinates of the shot areas are calculated by statistical processing of the results of said measurement, the positioning of the shot areas is conducted, based on thus calculated coordinates. Thus, in the present invention, the offset from the amount of defocus at the measuring point of the focus detection means within each sample area is determined at the measurement of the coordinate of the sample area, and the height of the substrate is selected by correction with said offset at the exposure of the shot area to the projected image of the mask pattern, so that the area requiring exact focusing can be most exactly focused to the focal plane of the projection optical system.

In this method, at the determination of the offset of the amount of defocus in each sample area, it is also possible to determine the angle of inclination of each sample area for example by detecting the amounts of defocus at the four corners of each sample area. It is therefore rendered possible to correct not only the focus position but also the inclination angle, by correcting each shot area for the inclination based on the averaged angle of inclination.

BRIEF DESCRIPTION OF THE DRAWINGS

FIG. 6 is a flow chart showing a second embodiment of the method of exposure of the present invention;

DESCRIPTION OF THE PREFERRED EMBODIMENTS

In the following there will be explained a first embodiment of the method of exposure of the present invention, with reference to the attached drawings.

Figure 2:
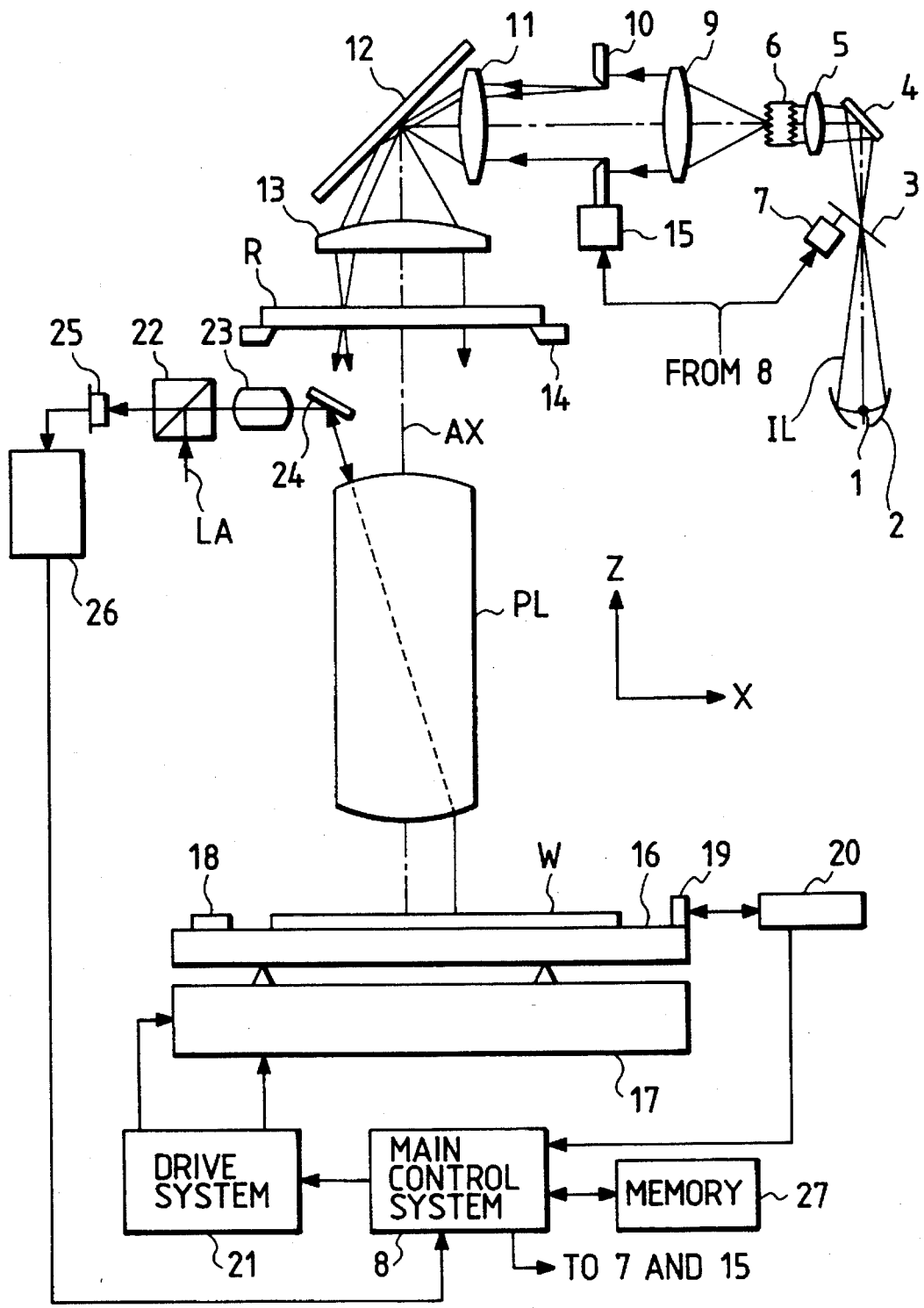
FIG. 2 is a schematic view of an illuminating optical system and an alignment sensor of a projection exposure apparatus in which the method of exposure shown in FIG. 1 is applicable.

FIG. 2 illustrates the schematic configuration of a projection exposure apparatus, adapted for application of the method of exposure of the present invention. Referring to FIG. 2, illuminating light IL, emitted from an ultra-high pressure mercury lamp 1, is reflected by an elliptical mirror 2, then once condensed at the second focal point thereof, further guided by a mirror 4 and an input lens 5 and enters fly's eye lenses 6 which are so positioned, along a plane perpendicular to the optical axis AX, that the focal plane at the reticle side substantially coincides with a Fourier transformation plane (plane conjugate with pupil) of a reticle pattern.

In the vicinity of the second focal point of the elliptical mirror 2, there is provided a shutter (for example a rotary shutter with four blades) for opening and closing the optical path of the illuminating light IL by means of a motor 7. A main control system 8, controlling the functions of the entire apparatus, controls the function of the shutter 3 through the motor 7. The illuminating light for exposure may be obtained, not only from the emission spectrum of the mercury lamp 1, but also from light from an excimer laser (such as KrF or ArF excimer laser), or a harmonic wave of a metal vapor laser or a YAG laser.

Again referring to FIG. 2, the illuminating light IL of a wavelength region, (for example of i-line) actinic to a photoresist layer on the wafer, emitted from the fly's eye lens as 6, is guided through a first relay lens 9, a variable reticle blind 10 and a second relay lens 11 and reaches a mirror 12. The illuminating light IL, reflected by said mirror 12 substantially vertically downwards, illuminates a pattern area of a reticle R with a substantially uniform intensity, through a condenser lens 13. The plane of the reticle blind 10 is in conjugate (imaging) relationship with the pattern-bearing face of the reticle R. The illumination field of the reticle R can be arbitrarily selected by the main control system 8, which varies the dimension, shape and position of the aperture of the reticle blind 10 by moving, through a drive system 15, plural movable blades constituting said reticle blind 10.

The illuminating light IL, transmitted by the pattern area of the reticle R, enters a projection optical system PL which is telecentric on both sides. Thus a projected image, reduced to ⅕ by the projection optical system PL, of the circuit pattern of the reticle R is projected in alignment with a shot area of a wafer W, bearing a photoresist layer on the surface thereof and so supported that the surface thereof substantially coincides with the best focal plane of the projection optical system PL.

The wafer W is attached by suction to a wafer holder (not shown) capable of fine rotational movement, and is supported on a levelling stage 16 by means of said wafer holder. The levelling stage 16 is supported, by means of vertically movable three supporting points, on a wafer stage 17, which can perform two-dimensional movement in step-and-repeat manner by the main control system 8 through a drive system 21. When the exposure of the image of the pattern of the reticle R is completed for a shot area on the wafer W, the wafer stage 17 is stepped to a next shot position. At an end of the levelling stage 16 there is fixed a movable mirror 19 for reflecting the laser beam from a laser interferometer 20. The two-dimensional coordinate of the wafer W together with the wafer stage 17 is constantly detected by said laser interferometer 20, with a resolving power for example of about 0.01 µm. The laser interferometer 20 measures the coordinates in a direction (X-direction) perpendicular to the optical axis of the projection optical system PL and in a Y-direction perpendicular to said X-direction. The stage coordinate system (fixed coordinate system X, Y) of the wafer stage 17 is defined by the above-mentioned coordinates in the X- and Y-directions. Stated differently, the coordinate values of the levelling stage 16, measured by the laser interferometer 20, are those of the stage coordinate system (X, Y).

Also the fine adjustments of the inclination angle of the levelling stage 16 and of the position (focus position) in the direction of optical axis AX of the projection optical system PL are achieved by the adjustments in length of the three supporting points on the wafer stage 17. The wafer stage 17 also includes a Z-stage for a large movement of the wafer W in the direction of the optical axis AX (Z-direction).

On the levelling stage 16 there is further provided a reference member (glass substrate) 18, bearing reference marks to be used, for example, in the measurement of the baseline amount to be explained later, at a height substantially same as that of the exposed surface of the wafer W. On said reference member 18 there are formed various reference marks.

At a lateral position above the projection optical system PL, there is provided an alignment sensor of TTL (through-the-lens) system. Said alignment sensor serves to detect the position of an alignment mark (wafer mark) on the wafer W through the projection optical system PL, by so-called laser step alignment method (LSA method) by causing a relative movement between the laser beam and the alignment mark and processing the diffracted light from the alignment mark as disclosed in the U.S. Pat. No. 4,677,301. In the above-mentioned alignment sensor, a light beam LA from an unrepresented light beam generating system is reflected by a beam splitter 22, and is guided to the projection optical system PL through an objective lens 23 and a mirror 24. This light beam irradiates, through the projection optical system PL, the wafer mark consisting of a dot train on the wafer W, and the light reflected from said wafer mark returns to a photosensor element 25 through the projection optical system PL, mirror 24, objective lens 23 and beam splitter 22. A photoelectrically converted signal from the photosensor element 25 is supplied to a signal processing system 26, which determines the position of the wafer mark on the wafer W, based on thus supplied signal.

More specifically, the light beam LA is projected onto the wafer W in the form of an oblong stripe-shaped light spot, extended for example in the X-direction within the exposure field of the projection optical system PL. The light generated from said wafer mark, when said light spot and the wafer mark (dot train) on the wafer W are moved in relative manner in the Y-direction, is received by the photosensor element 25 through the projection optical system PL, objective lens 23 etc.. The photosensor element 25 effects photoelectric conversion only on the ±1st–3rd order diffracted light, among the light coming from the wafer mark, and the signal corresponding to the light intensity, obtained by such photoelectric conversion, is supplied to the signal processing system 26. Said system 26 also receives the coordinate data from the laser interferometer 20, and samples the photoelectric conversion signal in synchronization with an up-down pulse generated for every unit movement of the wafer stage 17. Thus the main control system 8 receives, as the Y-coordinate of the wafer mark, for example the Y-coordinate of the center of the peak portion of the sample signal train. Similarly there is provided an alignment sensor for measuring the X-coordinate of another wafer mark for the X-direction, and the X-coordinate measured by said alignment sensor is supplied also to the main control system 8. These X- and Y-coordinates are stored in a memory 27 attached to the main control system 8.

There exists a difference, called baseline amount, between the measured coordinate of the wafer mark by the alignment sensor and the coordinate of the wafer mark when the shot area of the wafer W is set at the exposure position. Said baseline amount is therefore determined in advance by measuring the coordinate of the reference mark on the reference member 18 by the alignment sensor and is stored in the memory 27. For example, in case of alignment by die-by-die method, the main control system 8 positions each shot area by correcting the coordinate of the wafer mark, supplied from the signal processing system 26, with said baseline amount.

Now, with reference to FIG. 3, there will be explained an AF sensor (41–47) for auto focusing and an inclination angle detecting system (levelling sensor) (28–40) for auto levelling, in the projection exposure apparatus of the present embodiment. In the levelling sensor shown in FIG. 3, detecting light AL1, emitted from a light source 28 and non-actinic to the photoresist, is converted by a collimating lens 29 into a parallel beam, which is reflected by a mirror 38A and enters a grating plate 30. The detecting light AL1 transmitted by the grating plate 30 is condensed by a lens 31 in the aperture of a spatial filter 32, then converted by a lens 33 into a parallel light beam and irradiates the wafer W, obliquely with respect to the optical axis AX of the projection optical system PL.

The detecting light AL1, reflected by the wafer W, is once condensed and then diverges by a lens 34, then converted by a lens 35 into a parallel light beam and enters a receiver grating plate 36. By means of a slide mechanism 37, the receiver grating plate 36 is rendered capable of a fine movement, in a direction crossing the optical axis of the light receiving system, under the instruction of the main control system 8. For example a glass plate coated with photosensitive material is placed, instead of the wafer W, on the levelling stage 16, the precision of detection of the inclination angle may be deteriorated by the light reflected from the rear face of said glass plate. The grating plate 30 and the receiver grating plate 36 are provided for intercepting the reflected light from the rear face of the glass plate, and the position of the receiver grating plate 36 is regulated for example according to the thickness of the glass plate.

The detecting light AL1 emerging from the receiver grating plate 36 is reflected by a mirror 38B and is condensed by a condenser lens 39 onto the light-receiving face of a four-sectioned photosensor element 40, in which four photosensor elements respectively effect photoelectric conversion of the detecting light AL1 and supply the main control system 8 with photoelectric conversion signals. The main control system 8 determines the center of light intensity distribution on the light-receiving face of the four-sectioned photosensor element 40, based on the balance of four photoelectric conversion signals. Since the relationship between the center of light amount distribution and the inclination angle of the wafer W is determined in advance, the main control system 8 can determine the inclination angle of the wafer W from the photoelectric conversion signals supplied from the four-sectioned photosensor element 40.

In the AF sensor, detecting light AL2, emitted from a light source 41 and non-actinic to the photoresist, is transmitted by a slit in a slit plate 42, and irradiates the wafer W through a lens 43, obliquely with respect to the optical axis AX, thereby forming an image of said slit at a measuring point on the optical axis AX on the wafer W. The detecting light AL2, reflected from the wafer W, is condensed by a lens 44, then transmitted by a plain parallel-faced glass plate 45, onto a slit in a receiver split plate 46. The detecting light AL2, transmitted by said slit, is subjected to photoelectric conversion by a photosensor element 47. The receiver slit plate 46 is vibrated, with a predetermined frequency, in a direction perpendicular to the optical axis of the light-receiving system, and the main control system 8 receives a focus signal obtained by synchronized detection of the photoelectric conversion signal of the photosensor element 47 with said frequency.

Said focus signal varies linearly within a predetermined range, corresponding to the position, in the Z-direction, of the measuring point on the wafer W. Also calibration is made in advance in such a manner, by the adjustment of the inclination angle of the plain parallel-faced glass plate 45, that the reflected light from the wafer W enters the center of vibration of the slit of the receiver slit plate 46, whereby the focus signal becomes zero, when the measuring point on the wafer W coincides with the focal plane of the projection optical system PL. Said focus signal is subjected to analog-to-digital (A/D) conversion in the main control system 8 and is stored in the memory 27. In said memory 27, digital data of the focus signal are stored respectively corresponding to the addresses for the coordinates of the wafer stage 17, measured by the laser interferometer 20. Consequently the focus signal, stored in the memory 27, represents the shape of step difference on the wafer W, on the stage coordinate system (X, Y). Thus, based on the data stored in the memory 27, the main control system 8 can obtain the focus signal of any desired area on the wafer W, and the amount of defocus from the focal plane of the projection optical system PL.

Figure 4A:
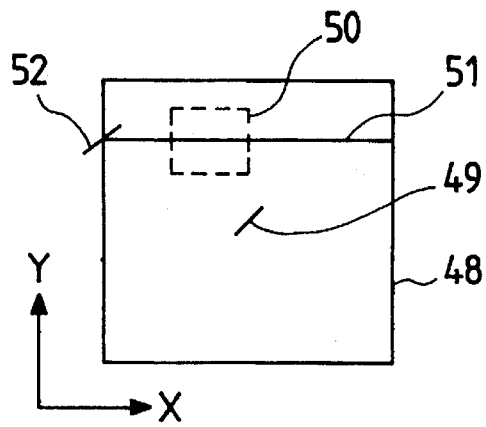
FIG. 4A is a magnified plan view of an exposure shot 48 of the first embodiment.

In the following there will be explained, with reference to a flow chart shown in FIG. 1, the operations in this embodiment of positioning a predetermined shot area to be exposed (hereinafter called exposure shot) on the wafer and exposing said exposure shot area to the projected image of the pattern of the reticle R. FIG. 4A shows an exposure shot area 48 on the wafer. The coordinate data of an area 50, where the projected image of the pattern has the narrowest line width within the exposure shot area 48, are stored in advance in the memory 27. At first a wafer W to be exposed is loaded on the levelling stage 16 shown in FIG. 2.

Figure 1:
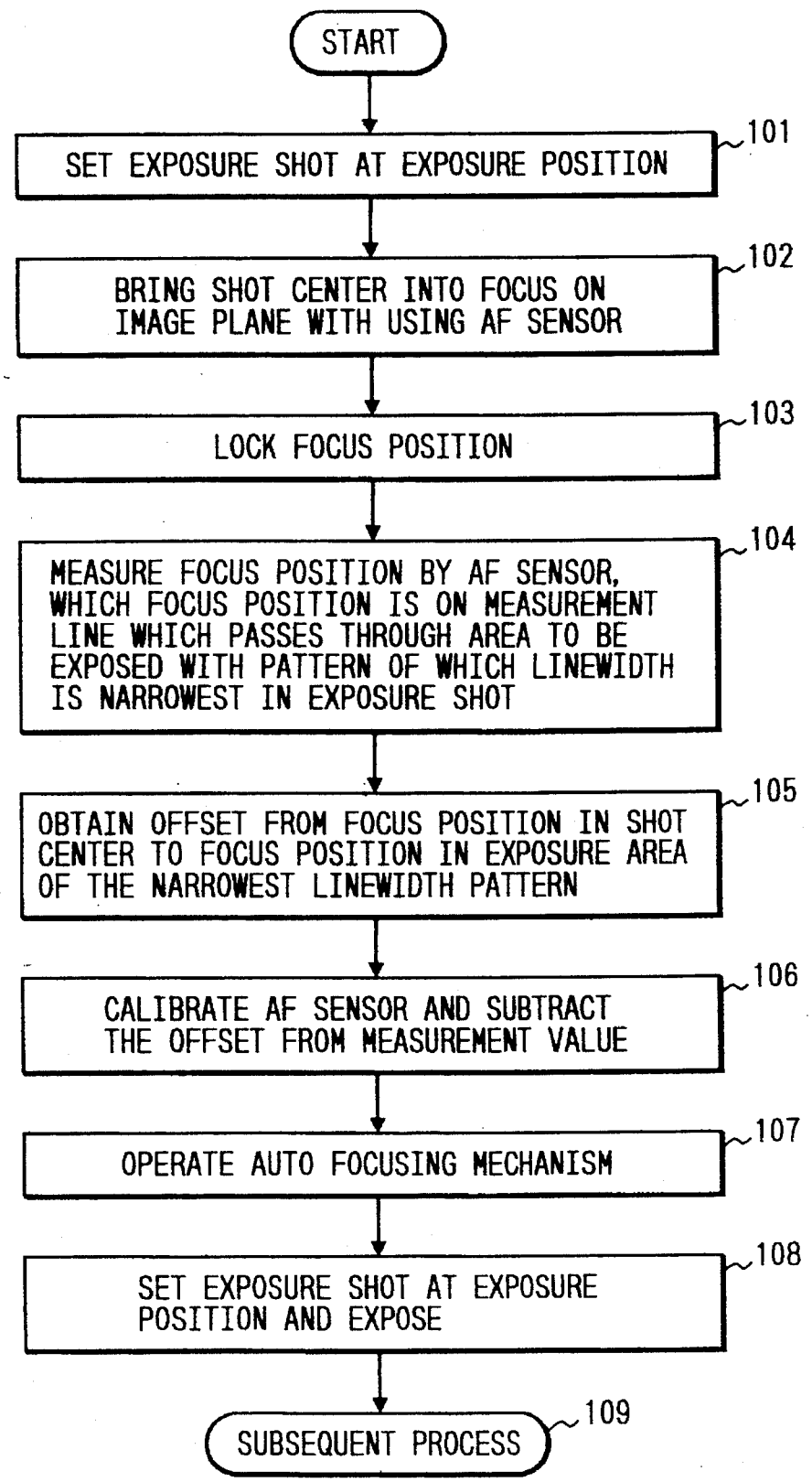
FIG. 1 is a flow chart showing a first embodiment of the method of exposure of the present invention.

Then, in a step 101 in FIG. 1, the wafer stage 17 sets the exposure shot area 48 (cf. FIG. 4A) of the wafer W approximately at the exposure position within the exposure field of the projection optical system PL. In this state, the alignment sensor (22–26) shown in FIG. 2 measures the coordinate of the wafer mark (not shown) attached to said exposure shot area 48, and, based on the result of said measurement, the wafer stage 17 positions the exposure shot area 48 at the exposure position.

Figure 3:
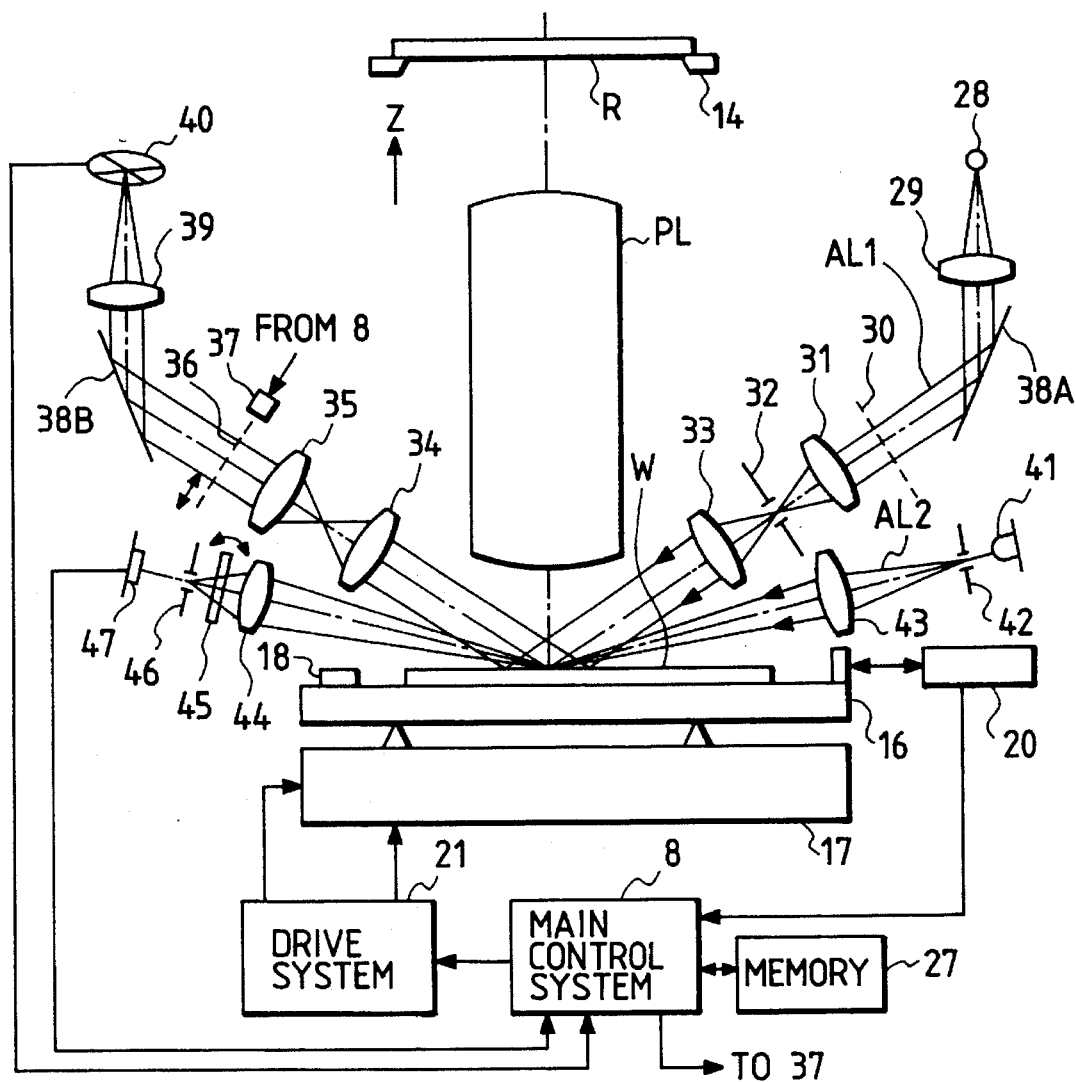
FIG. 3 is a schematic view of an AF sensor and a levelling sensor in the projection optical system shown in FIG. 2.

Then, in a step 102, the AF sensor (41–47) shown in FIG. 3 projects a slit pattern image 49 at the center (shot center) of the exposure shot area 48, then obtains the focus signal by photoelectric conversion of an image, formed from said slit pattern image 49 through the receiver slit plate 46, and regulates the height of the levelling stage 16 so as that said focus signal becomes zero. Thus the shot center of the exposure shot area 48 is aligned with the focal plane of the projection optical system PL, and the focus position of the wafer W is locked in this state (step 103).

Then, in a step 104, the wafer W is moved in a scanning motion by the wafer stage 17, whereby a slit pattern image 52 from the AF sensor is scanned along a measuring line 15, which passes, in the X-direction, an area 50 where the projected pattern image has the narrowest line width within the exposure shot 48 on the wafer W, and the focus signal is sampled, in correspondence with the stage coordinate (X, Y) on the measuring line 51. Said focus signal represents the focus position on different points on the measuring line 51.

Figure 4B:
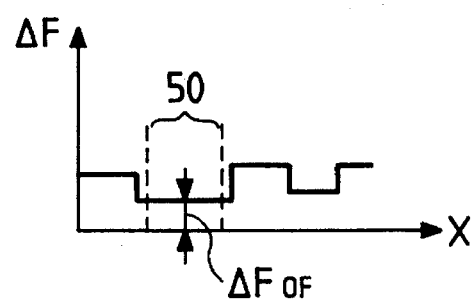
FIG. 4B is a view showing the distribution of focus position along a measuring line 51 on the exposure shot 48.

Subsequently, in a step 105, based on the focus signal along the measuring line 51, the main control system 8 determines the focus position $\Delta F$ along the measuring line 51, extending in the X-direction, as shown in FIG. 4B. Said focus position $\Delta F$ is so calibrated in advance as to become zero at the shot center of the exposure shot 48. Then there is determined an offset $\Delta F_{OF}$ between the focus position at the area 50 where the projected pattern image has the narrowest line width and the focus position at the shot center. Then in a step 106, the main control system 8 effects calibration of the AF sensor (41–47) shown in FIG. 3, by varying the inclination angle of the plain parallel-faced glass plate 45 so as to annulate said offset $\Delta F_{OF}$, whereby the focus signal becomes zero when the slit pattern image (for example 49) formed by the AF sensor is projected on a plane, which is lower by the offset $\Delta F_{OF}$ than the focal plane of the projection optical system PL.

Then, in a step 107, the auto focusing mechanism is activated, and, in a step 108, the image of the pattern of the reticle R is projected onto the exposure shot 48. Subsequently, in a step 109, exposures are conducted on other exposure shots of the wafer W. Consequently the exposure to the image of the pattern of the reticle R can be conducted in a state in which the area 50 where the projected pattern image has the narrowest line width within the exposure shot area 48 coincides with the focal plane of the projection optical system PL.

Figure 5:
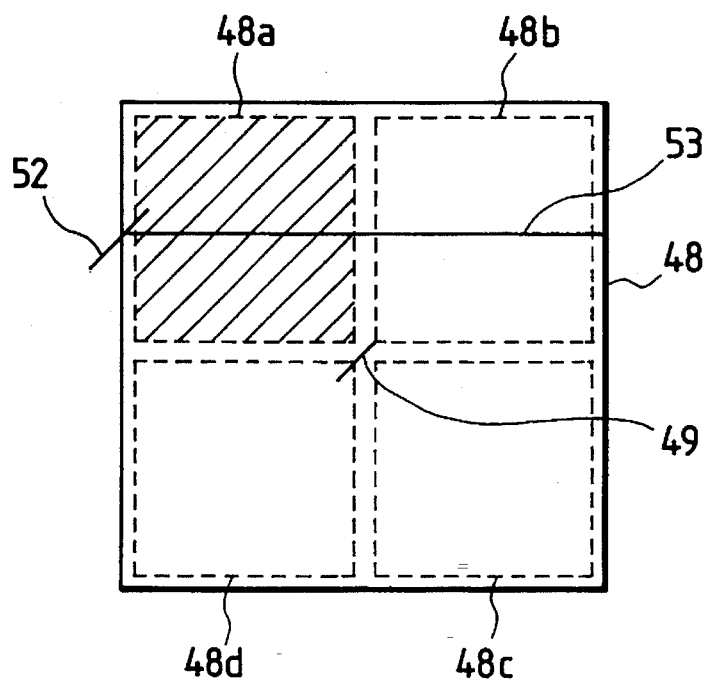
FIG. 5 is a magnified plan view of an exposure shot 48 in a variation of the first embodiment.

In the following there will be explained a variation of the first embodiment, with reference to FIG. 5, which illustrates an exposure shot 48 on the wafer W in said variation. In FIG. 5, the exposure shot 48 is divided into four partial shots 48a–48d, which respectively receive different reticle images. In the following there will be considered a case of projecting the image of a pattern, selected by the field diaphragm 10 from the pattern of the reticle R shown in FIG. 2, onto the partial shot 48a shown in FIG. 5.

In this case, in a step corresponding to the step 102 in FIG. 1, the slit pattern image 49 is projected by the AF sensor onto the shot center of the exposure shot 48 shown in FIG. 5, and said shot center is focused to the focal plane. Then, in a step corresponding to the step 104 in FIG. 1, the wafer W is moved in a scanning motion by the wafer stage 17 shown in FIG. 2, whereby the slit pattern image 52 formed by the AF sensor is scanned along a measuring line 53 passing the partial shot 48a which is subjected to the projection of a pattern selected by the field diaphragm 10 within the exposure shot 48 on the wafer W. In this operation, the focus signal is sampled in correspondence with the stage coordinate (X, Y) on said measuring line 53.

Then, in a step corresponding to the step 106, there is conducted the calibration of the AF sensor (41–47) shown in FIG. 3, whereby, in this variation, the averaged plane of the partial shot 48a within the exposure shot 48 is focused to the focal plane of the projection optical system PL and the imaging characteristics in said partial shot 48a can thus be improved.

In the following there will be explained a second exposure method of the present invention, with reference to FIGS. 6, 7A, 7B and 7C. The projection exposure apparatus employed in this embodiment is same as that already explained with reference to FIGS. 2 and 3. This second embodiment is an application of the first embodiment in case the alignment is conducted by so-called enhanced global alignment (EGA) method.

Figure 7A:
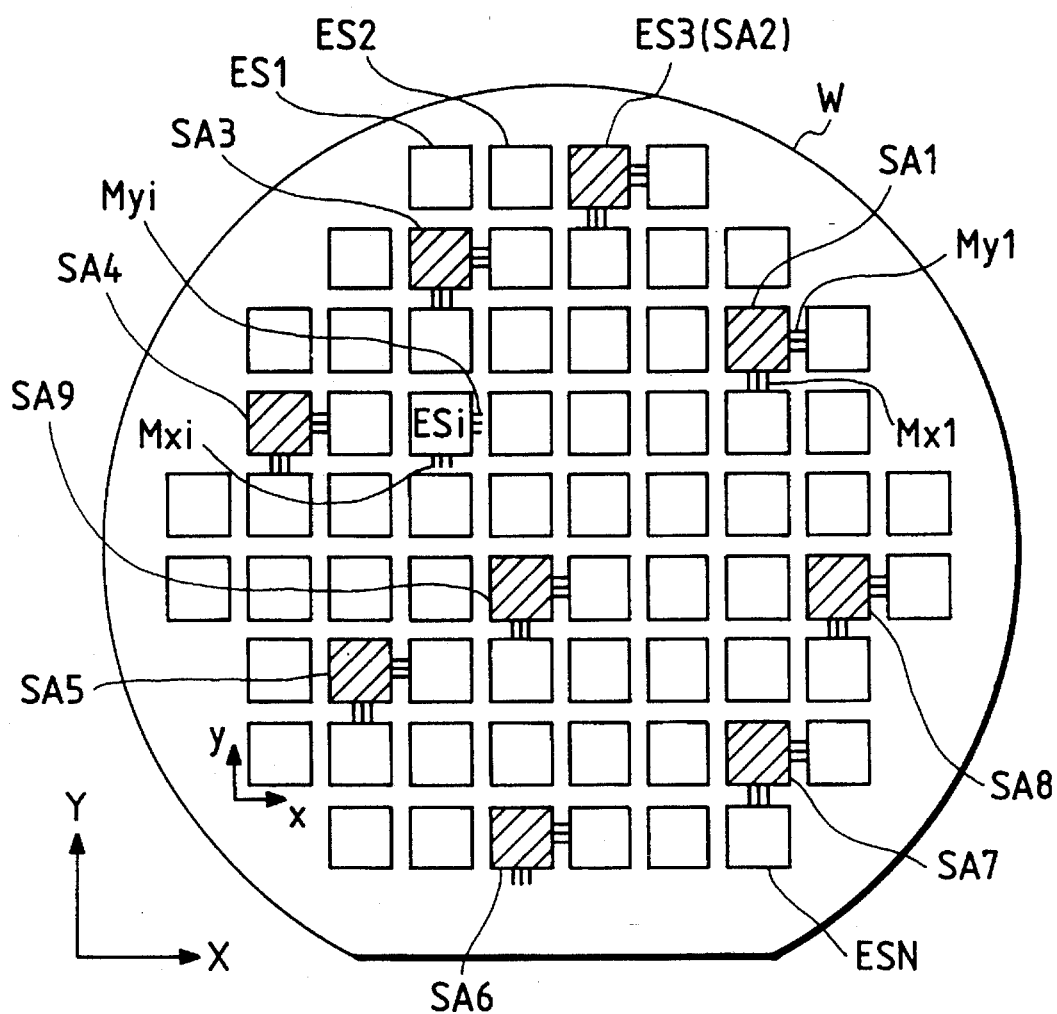
FIG. 7A is a plan view showing the arrangement of exposure shots and sample shots on the wafer to be exposed in the second embodiment.

FIG. 7A illustrates a wafer W to be exposed in this second embodiment. In the EGA method, the alignment sensor measures the coordinate on the stage coordinate system (X, Y), only on certain exposure shots SA1–SA9 (hereinafter called sample shots) selected from all the exposure shots ES1–ESN on the wafer W. The main control system 8 calculates the coordinates of the exposure shots ES1–ESN by statistical processing of the results of said measurement, and effects the positioning of the exposure shots ES1–ESN by the wafer stage 17, based on thus calculated coordinates.

As shown in FIG. 7A, the exposure shots ES1, ES2, . . . , ESN are formed on the wafer W in regular manner along a coordinate system (x, y) defined on the wafer W. In each exposure shot ESi there is formed a chip pattern by certain process steps which have been completed in the past. Also each exposure shot ESi is separated by street lines of predetermined widths, extending in the X- and Y-directions. At the center of a street line adjacent to each exposure shot ESi and extending in the X-direction, there is formed a wafer mark Mxi for the X-direction. Also at the center of a street line adjacent to each exposure shot ESi and extending in the Y-direction, there is formed a wafer mark Myi for the Y-direction. Said wafer mark Mxi for the X-direction or wafer mark a Myi for the Y-direction is composed of an array of three dot pattern trains, respectively in the x- or y-direction, with a predetermined pitch, and such patterns are formed as recesses or projections on the surface of the wafer W.

At first the wafer W is placed on the levelling stage 16 shown in FIG. 2, and a step 111 shown in FIG. 6 initializes a variable j to 1. Then a step 112 measures the coordinate, on the stage coordinate system (X, Y), of a 1st sample shot SA1 shown in FIG. 7A, by measuring the coordinates of the wafer marks associated with said sample shot SA1. In this operation, the shot center of the sample shot SA1 is focused to the focal plane of the projection optical system PL. Then, in a step 113, the wafer W is moved in a scanning motion by the wafer stage 17 with the locked focus position, whereby the slit pattern image 52 formed by the AF sensor is scanned along a measuring line 51 which passes, in the X-direction, the area 50 where the projected pattern image has the narrowest line width within the sample shot SA1 on the wafer W. In this operation, the focus signal is sampled in correspondence with the stage coordinate (X, Y) on the measuring line 51. Said focus signal indicates the focus position on different points on said measuring line 51.

Figure 7B:
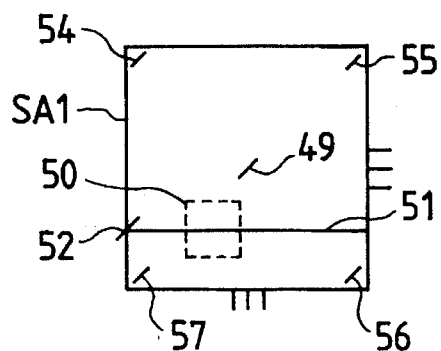
FIG. 7B is a magnified plan view of a sample shot SA1.
Figure 7C:
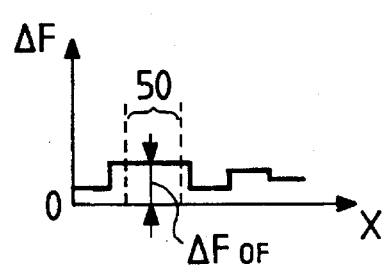
FIG. 7C is a view showing the distribution of focus position along a measuring line 51 on the sample shot SA1.

Then, in a step 114, the main control system 8 determines the focus position ΔF along the measuring line 51, extending in the X-direction, as shown in FIG. 7C, from the focus signal along said measuring line 51, and also determines the offset $\Delta F_{OF}$ which is the projected pattern image has the narrowest line width and the focus position at the shot center. Then, after a step 115 increases the value of the variable j by 1, the main control system 8 discriminates, in a step 116, whether the variable j has exceeded the number m of the sample shots (m=9 in FIG. 7A). If not, the steps 112 to 115 are repeated to determine, for each sample shot Aj, the coordinate on the stage coordinate system, and the offset $\Delta F_{OF}$ of the focus position of the area 50.

After the measurements have been completed on all the sample shots SA1–SA9, a step 117 determines the average of the offsets $\Delta F_{OF}$ at nine focus positions. Then the calibration is conducted in a step 118 in such a manner that the focus signal becomes zero when the shot center of each exposure shot is positioned lower, by the average of the offsets $\Delta F_{OF}$, then the focal plane of the projection optical system PL.

A next step 119 effects alignment by the EGA method, utilizing the results of measurements of the nine sample shots. More specifically, the first-order transformation model, for transforming the coordinate system (x, y) on the wafer W as shown in FIG. 7A into the stage coordinate system (X, Y) is represented in the following manner, with six transformation parameters a–f:

$$\begin{pmatrix} X \\ Y \end{pmatrix} = \begin{pmatrix} a & b \\ c & d \end{pmatrix} \begin{pmatrix} x \\ y \end{pmatrix} + \begin{pmatrix} e \\ f \end{pmatrix} \quad (1)$$

The six parameters a–f in this equation are determined by the following minimum square approximation. The remnant error component is represented by the following equation, in which (XMn, YMn) indicates the coordinate value of the n-th sample shot SAn (n=1–9) measured on the stage coordinate system, and (Xn, Yn) indicates the coordinate value calculated according to the equation (1) from the design coordinate value. In the example shown in FIG. 7A, m is equal to 9:

$$\text{Remnant error component} = \sum_{n=1}^{m} [(Xn - XMn)^2 + (Yn - YMn)^2] \quad (2)$$

The transformation parameters a–f of the equation (1) are so determined as to minimize said remnant error component, and this calculation is called EGA calculation. Then the coordinate of arrangement of each exposure shot ESi is calculated from said transformation parameters a–f and the design coordinate value of each exposure shot ESi (i=1–N) on the wafer W, and each exposure shot ESi is aligned according to said coordinate of arrangement, for exposure to the image of the pattern of the reticle R. Subsequently, a step 119 effects the exposure to a next wafer. In this manner the present embodiment can achieve exact positioning of the exposure shots ES1– ESN of the wafer W with a reduced time for measurement of the wafer marks, and can also achieve exact focusing of the area, having the narrowest line width, in each of the exposure shots ES1–ESN to the focal plane of the projection optical system PL.

Also in the step 112 of this second embodiment, there may be further determined the inclination angles of the sample shots SA1–SA9 from the focus positions of four corners thereof, by projecting, as shown in FIG. 7B, slit pattern images 54–57 in succession from the AF sensor onto said four corners of the sample shots SA1–SA9. Then the average value of said nine inclination angles is determined in the step 117, and the levelling sensor (28–40) shown in FIG. 3 is calibrated in the step 118 in order to bring the averaged plane of the sample shots SA1–SA9 parallel to the focal plane of the projection optical system PL. Through these operations, the exposed surface of the exposure shots ES1–ESN becomes in average parallel to said focal plane, whereby the imaging characteristics are further improved.

The present invention is naturally not limited to the foregoing embodiments but is subject to various modifications within the scope of the present invention.

According to the first or second method of exposure of the present invention, since the correction is made for the offset between the amount of defocus in the area requiring most exact focusing (projection area of the pattern of narrowest line width or projection area of the pattern selected by the field diaphragm) and that of predetermined measuring point, such area requiring most exact focusing within the shot area can be precisely focused to the focal plane.

Also since the offset (difference) is determined between the actual amount of defocus of the shot area at the exposure position and the amount of defocus of the plane to be focused, it is made possible to reduce the fluctuation in the amount of defocus, among different projection exposure apparatus.

Furthermore, according to the third method of exposure, since the offsets of the amounts of defocus measured on the sample areas are averaged, it is rendered possible to effect the exposure by focusing the area, requiring most exact focusing in each shot area, to the focal plane with a reduced measuring time.

Also in case of correcting each shot area for the inclination angle, based on the average of the inclination angles measured on the sample areas, it is made possible to achieve more precise levelling of each shot area with a reduced measuring time.

What is claimed is:

1. An exposure method of detecting, by a focus detection mechanism, the amount of difference of a measuring point on a substrate in the axial direction of a projection optical system, with reference to the focal plane of said projection optical system, and moving said substrate to a predetermined height by a Z-stage loaded with said substrate and movable in the axial direction of said projection optical system, based on the detected value of said focus detection mechanism, thereby exposing a shot area on said substrate to the projected image of a pattern on a mask, comprising:

a first detection step for detecting, by said focus detection mechanism, a first amount of defocus which is the amount of difference, in the axial direction of said projection optical system, between the focal plane of said projection optical system and a predetermined measuring point in said shot area;

a second detection step for detecting, by said focus detection mechanism, a second amount of defocus which is the amount of difference, in the axial direction of said projection optical system between the focal plane of said projection optical system and the surface of an area, within said shot area, where the projected image of the pattern of said mask has the narrowest line width;

a calculation step for calculating the offset which is the difference between said first and second amounts of defocus; and a determination step for determining the detection value of said focus detection mechanism by correcting the first amount of defocus with said offset.

2. An exposure method according to claim 1, wherein the measuring point of the first amount of defocus in the first detection step is the center of said shot area.

3. An exposure method of detecting, by a focus detection mechanism, the amount of difference of a measuring point on a substrate in the axial direction of a projection optical system, with reference to the focal plane of said projection optical system, and moving said substrate to a predetermined height by a Z-stage loaded with said subsrate and movable in the axial direction of said projection optical system, based on the detected value of said focus detection mechanism, thereby exposing a shot area on said substrate to the projected image of a pattern on a mask, comprising:

a first detection step for detecting, by said focus detection mechanism, a first amount of defocus which is the amount of difference, in the axial direction of said projection optical system, between the focal plane of said projection optical system and a predetermined measuring point in said shot area;

a second detection step for scanning said substrate in a plane perpendicular to the optical axis of said projection optical system and detecting, by said focus detection mechanism, the distribution of the amount of defocus on a measuring line which passes an area where the projected pattern image has the narrowest line width within said shot area on said substrate, thereby detecting a second amount of defocus corresponding to the surface of said area of the narrowest line width;

a calculation step for calculating the offset which is the difference between said first and second amounts of defocus; and a determination step for determining the detection value of said focus detection mechanism by correcting the first amount of defocus with said offset.

4. An exposure method according to claim 3, wherein said second detection step effects the scanning while said Z-stage is fixed.

5. An exposure method according to claim 3, wherein the measuring point of the first amount of defocus in the first detection step is the center of said shot area.

6. An exposure method of detecting, by a focus detection mechanism, the amount of difference of a measuring point on a substrate in the axial direction of a projection optical system, with reference to the focal plane of said projection optical system, and moving said substrate to a predetermined height by a Z-stage loaded with said substrate and movable in the axial direction of said projection optical system, based on the detected value of said focus detection mechanism, thereby exposing a shot area on said substrate to the projected image of a pattern on a mask, comprising:

a first detection step for detecting, by said focus detection mechanism, a first amount of defocus which is the amount of difference, in the axial direction of said projection optical system, between the focal plane of said projection optical system and a predetermined measuring point in said shot area;

a second detection step for detecting, by said focus detection mechanism, a second amount of defocus which is the amount of difference, in the axial direction of said projection optical system between the focal plane of said projection optical system and the surface selected, within the shot area by a blind for selecting the pattern of the mask to be projected;

a calculation step for calculating the offset which is the difference between said first and second amounts of defocus; and a determination step for determining the detection value of said focus detection mechanism by correcting the first amount of defocus with said offset.

7. An exposure method according to claim 6, wherein the measuring point of the first amount of defocus in the first detection step is the center of said shot area.

8. An exposure method of detecting, by a focus detection mechanism, the amount of difference of a measuring point on a substrate in the axial direction of a projection optical system, with reference to the focal plane of said projection optical system, and moving said substrate to a predetermined height by a Z-stage loaded with said substrate and movable in the axial direction of said projection optical system, based on the detected value of said focus detection mechanism, thereby exposing a shot area on said substrate to the projected image of a pattern on a mask, comprising:

a first detection step for detecting, by said focus detection mechanism, a first amount of defocus which is the amount of difference, in the axial direction of said projection optical system, between the focal plane of said projection optical system and a predetermined measuring point in said shot area;

a second detection step for scanning substrate in a plane perpendicular to the optical axis of said projection optical system and detecting, by said focus detection mechanism, the distribution of the amount of defocus on a measuring line which passes the surface selected within a shot area by a blind for selecting the pattern on the mask to be projected, thereby detecting a second amount of defocus corresponding to said selected surface;

a calculation step for calculating the offset which is the difference between said first and second amounts of defocus; and a determination step for determining the detection value of said focus detection mechanism by correcting the first amount of defocus with said offset.

9. An exposure method according to claim 8, wherein said second detection step effects the scanning while said Z-stage is fixed.

10. An exposure method according to claim 8, wherein the measuring point of the first amount of defocus in the first detection step is the center of said shot area.

11. An exposure method of detecting, by a focus detection mechanism, the amount of difference of a measuring point on a substrate in the axial direction of a projection optical system, with reference to the focal plane of said projection optical system, and moving said substrate to a predetermined height by a Z-stage loaded with said substrate and movable in the axial direction of said projection optical system, based on the detected value of said focus detection mechanism, thereby exposing a shot area on said substrate to the projected image of a pattern on a mask, comprising:

a first detection step for detecting, by said focus detection mechanism, first amounts of defocus which are the amounts of difference, in the axial direction of said projection optical system, between predetermined measuring points in sample areas of a certain number preselected from plural shot areas on the substrate and the focal plane of said projection optical system;

a second detection step for detecting, by said focus detection mechanism, in each of said sample areas, a second amount of defocus which is the amount of difference, in the axial direction of said projection optical system, between the surface, within said sample area, where the projected image of the pattern of said mask has the narrowest line width and the focal plane of said projection optical system;

a calculation step for determining the average of the offset which are the differences between the first and second amounts of defocus in all said sample areas, based on the first and second amounts of defocus in each of said sample areas; and a movement step for moving said substrate to a predetermined height, based on said offset and the detected value by said focus detection mechanism.

12. An exposure method according to claim 11, wherein the measuring points of the first amounts of defocus in the first detection step are the centers of said sample areas.

13. An exposure method according to claim 11, wherein:

said first detection step further detects, by said focus detection mechanism, amounts of defocus at four corners of each of said sample areas;

said calculation step further calculates the average of the inclination angle of said substrate, with reference to the focal plane of said projection optical system, based on the amounts of defocus at the four corners of each of said sample areas; and said exposure method further comprises an inclination correcting step for correcting the inclination angle of said substrate, based on said average of the inclination angle.

14. An exposure method of detecting, by a focus detection mechanism, the amount of difference of a measuring point on a substrate in the axial direction of a projection optical system, with reference to the focal plane of said projection optical system, and moving said substrate to a predetermined height by a Z-stage loaded with said substrate and movable in the axial direction of said projection optical system, based on the detected value of said focus detection mechanism, thereby exposing a shot area on said substrate to the projected image of a pattern on a mask, comprising:

a first detection step for detecting, by said focus detection mechanism, first amounts of defocus which are the amounts of difference, in the axial direction of said projection optical system, between predetermined measuring points in sample areas of a certain number preselected from plural shot areas on the substrate and the focal plane of said projection optical system;

a second detection step for scanning said substrate in a plane perpendicular to the optical axis of said projection optical system and detecting, by said focus detection mechanism, the distribution of the amount of defocus on a measuring line passing an area where the projected pattern image has the narrowest line width within said shot area on said substrate, thereby detecting, in each of said shot areas, a second amount of defocus corresponding to the surface of said area with narrowest line width;

a calculation step for determining the average of the offsets which are the differences between the first and second amounts of defocus in all said sample areas, based on the first and second amounts of defocus in each of said sample areas; and a movement step for moving said substrate to a predetermined height, based on said offset and the detected value by said focus detection mechanism.

15. An exposure method according to claim 14, wherein said second detection step effects scanning while said Z-stage is fixed.

16. An exposure method according to claim 14, wherein the measuring points of the first amounts of defocus in the first detection step are the centers of said shot areas.

17. An exposure method according to claim 14, wherein:

said first detection step further detects, by said focus detection mechanism, amounts of defocus at four corners of each of said sample areas;

said calculation step further calculates the average of the inclination angle of said substrate, with reference to the focal plane of said projection optical system, based on the amounts of defocus at the four corners of each of said sample areas; and said exposure method further comprises an inclination correcting step for correcting the inclination angle of said substrate, based on said average of the inclination angle.

18. An exposure method of detecting, by a focus detection mechanism, the amount of difference of a measuring point on a substrate in the axial direction of a projection optical system, with reference to the focal plane of said projection optical system, and moving said substrate to a predetermined height by a Z-stage loaded with said substrate and movable in the axial direction of said projection optical system, based on the detected value of said focus detection mechanism, thereby exposing a shot area on said substrate to the projected image of a pattern on a mask, comprising:

a first detection step for detecting, by said focus detection mechanism, first amounts of defocus which are the amounts of difference, in the axial direction of said projection optical system, between predetermined measuring points in sample areas of a certain number preselected from plural shot areas on the substrate and the focal plane of said projection optical system;

a second detection step for detecting, by said focus detection mechanism, in each of said sample areas, a second amount of defocus which is the amount of difference, in the axial direction of said projection optical system, between the focal plane of said projection optical system and the surface selected within a shot area by a diaphragm for selecting the pattern on the mask to be projected;

a calculation step for determining the average of the offset which are the differences between the first and second amounts of defocus in all said sample areas, based on the first and second amounts of defocus in each of said sample areas; and a movement step for moving said substrate to a predetermined height, based on said offset and the detected value by said focus detection mechanism.

19. An exposure method according to claim 18, wherein said second detection step effects scanning while said Z-stage is fixed.

20. An exposure method according to claim 18, wherein the measuring points of the first amounts of defocus in the first detection step are the centers of said shot areas.

21. An exposure method according to claim 18, wherein:

said first detection step further detects, by said focus detection mechanism, amounts of defocus at four corners of each of said sample areas;

said calculation step further calculates the average of the inclination angle of said substrate, with reference to the focal plane of said projection optical system, based on the amounts of defocus at the four corners of each of said sample areas; and said exposure method further comprises an inclination correcting step for correcting the inclination angle of said substrate, based on said average of the inclination angle.

22. An exposure method of detecting, by a focus detection mechanism, the amount of difference of a measuring point on a substrate in the axial direction of a projection optical system, with reference to the focal plane of said projection optical system, and moving said substrate to a predetermined height by a Z-stage loaded with said substrate and movable in the axial direction of said projection optical system, based on the detected value of said focus detection mechanism, thereby exposing a shot area on said substrate to the projected image of a pattern on a mask, comprising:

a first detection step for detecting, by said focus detection mechanism, a first amounts of defocus which are the amounts of difference, in the axial direction of said projection optical system, between predetermined measuring points in sample areas of a certain number preselected from plural shot areas on the substrate and the focal plane of said projection optical system;

a second detection step for scanning said substrate in a plane perpendicular to the optical axis of said projection optical system and detecting, by said focus detection mechanism, the distribution of the amount of defocus on a measuring line passing the surface selected within the sample area by a blind for selecting the pattern of the mask to be projected, thereby detecting, in each of said sample areas, a second amount of defocus corresponding to said selected surface;

a calculation step for determining the average of the offsets which are the differences between the first and second amounts of defocus in all said sample areas, based on the first and second amounts of defocus in each of said sample areas; and a movement step for moving said substrate to a predetermined height, based on said offset and the detected value by said focus detection mechanism.

23. An exposure method according to claim 22, wherein said second detection step effects scanning while said Z-stage is fixed.

24. An exposure method according to claim 22, wherein the measuring points of the first amounts of defocus in the first detection step are the centers of said shot areas.

25. An exposure method according to claim 22, wherein:

said first detection step further detects, by said focus detection mechanism, amounts of defocus at four corners of each of said sample areas;

said calculation step further calculates the average of the inclination angle of said substrate, with reference to the focal plane of said projection optical system, based on the amounts of defocus at the four corners of each of said sample areas; and said exposure method further comprises an inclination correcting step for correcting the inclination angle of said substrate, based on said average of the inclination angle.

26. A method of projection exposure of a substrate to a mask pattern, comprising:

a first detection step for moving a substrate stage supporting the substrate in a plane perpendicular to the optical axis of a projection optical system and detecting, by a focus detection mechanism, in each of sample areas of a certain number preselected from plural shot areas on said substrate, a first amount of defocus which is the amount of difference, in the axial direction of said projection optical system, between the exposed surface of said sample area at a predetermined measuring point therein and the focal plane of said projection optical system;

a position detection step for detecting the coordinate position of each of said sample areas on the coordinate system of said substrate stage;

a second detection step for detecting, by said focus detection mechanism, in each of said sample areas, a second amount of defocus which is the amount of difference, in the axial direction of said projection optical system, between the surface of an area where the pattern image projected in each of said shot areas has the narrowest line width and the focal plane of said projection optical system;

a first calculation step for calculating the coordinates of said plural shot areas, based on the coordinate position of each of said sample areas;

a second calculation step for determining the average of the offsets which are the differences between the first and second amounts of defocus in all said sample areas, based on,the first and second amounts of defocus in each of said sample areas;

a first movement step for moving said substrate stage to a first shot area among said plural shot areas, based on the result of calculation of said second calculation step;

a third detection step for detecting, by said focus detection mechanism, a third amount of defocus which is the amount of difference, in the axial direction of said projection optical system, between the focal plane of said projection optical system at a predetermined measuring point and the exposed surface of said first shot area;

a second movement step for moving said substrate stage in the axial direction of said projection optical system, based on said third amount of defocus and said average of the offsets; and an exposure step for exposing said first shot area to said mask pattern.

27. A method of projection exposure according to claim 26, wherein the measuring point of the first amount of defocus is the center of said sample area, and the measuring point of said third amount of defocus is the center of the first shot area.

28. A method of projection exposure according to claim 26, wherein:

said first detection step further detects, by said focus detection mechanism, amounts of defocus at four corners of each of said sample areas;

said first calculation step further calculates the average of inclination angle of said substrate with reference to the focal plane of said projection optical system, based on the amounts of defocus at the four corners of each of said sample areas; and said method of projection exposure further comprises an inclination correcting step for correcting the inclination angle of said substrate, based on said average of the inclination angle.

29. A method of projection exposure of a substrate to a mask pattern, comprising:

a first detection step for moving a substrate stage supporting the substrate in a plane perpendicular to the optical axis of a projection optical system and detecting, by a focus detection mechanism, in each of sample areas of a certain number preselected from plural shot areas on said substrate, a first amount of defocus which is the amount of difference, in the axial direction of said projection optical system, between the exposed surface of said sample area at a predetermined measuring point therein and the focal plane of said projection optical system;

a position detection step for detecting the coordinate position of each of said sample areas on the coordinate system of said substrate stage;

a second detection step for scanning said substrate by moving an XY-stage movable in a plane perpendicular to the optical axis of said projection optical system and detecting, by said focus detection mechanism, the distribution of the amount of defocus on a measuring line which passes an area where the pattern image projected within said shot area on said substrate has the narrowest line width, thereby detecting, in each of said sample areas, a second amount of defocus corresponding to the surface of said area with the narrowest line width;

a first calculation step for calculating the coordinates of said plural shot areas, based on the coordinate position of each of said sample areas;

a second calculation step for determining the average of the offsets which are the differences between the first and second amounts of defocus in all said sample areas, based on the first and second amounts of defocus in each of said sample areas;

a first movement step for moving said substrate stage to a first shot area among said plural shot areas, based on the result of calculation of said second calculation step;

a third detection step for detecting, by said focus detection mechanism, a third amount of defocus which is the amount of difference, in the axial direction of said projection optical system, between the focal plane of said projection optical system at a predetermined measuring point and the exposed surface of said first shot area;

a second movement step for moving said substrate stage in the axial direction of said projection optical system, based on said third amount of defocus and said average of the offsets; and an exposure step for exposing said first shot area to said mask pattern.

30. A method of projection exposure according to claim 29, wherein said second detection step effects scanning while the movement of said substrate stage in the axial direction of said projection optical system is fixed.

31. A method of projection exposure according to claim 29, wherein the measuring point for said first amount of defocus is the center of said sample area, and the measuring point of said third amount of defocus is the center of the first shot area.

32. A method of projection exposure according to claim 29, wherein:

said first detection step further detects, by said focus detection mechanism, amounts of defocus at four corners of each of said sample areas;

said first calculation step further calculates the average of inclination angle of said substrate with reference to the focal plane of said projection optical system, based on the amounts of defocus at the four corners of each of said sample areas; and said method of projection exposure further comprises an inclination correcting step for correcting the inclination angle of said substrate, based on said average of the inclination angle.

33. A method of projection exposure of a substrate to a mask pattern, comprising:

a first detection step for moving a substrate stage supporting the substrate in a plane perpendicular to the optical axis of a projection optical system and detecting, by a focus detection mechanism, in each of sample areas of a certain number preselected from plural shot areas on said substrate, a first amount of defocus which is the amount of difference, in the axial direction of said projection optical system, between the exposed surface of said sample area at a predetermined measuring point therein and the focal plane of said projection optical system;

a position detection step for detecting the coordinate position of each of said sample areas on the coordinate system of said substrate stage;

a second detection step for detecting, in each of said sample areas, a second amount of defocus which is the amount of difference, in the axial direction of said projection optical system, between the focal plane of said projection optical system and a surface selected within said shot area by a field diaphragm for selecting the predetermined mask pattern to be projected;

a first calculation step for calculating the coordinates of said plural shot areas, based on the coordinate position of each of said sample areas;

a second calculation step for determining the average of the offsets which are the differences between the first and second amounts of defocus in all said sample areas, based on the first and second amounts of defocus in each of said sample areas;

a first movement step for moving said substrate stage to a first shot area among said plural shot areas, based on the result of calculation of said second calculation step;

a third detection step for detecting, by said focus detection mechanism, a third amount of defocus which is the amount of difference, in the axial direction of said projection optical system, between the focal plane of said projection optical system at a predetermined measuring point and the exposed surface of said first shot area;

a second movement step for moving said substrate stage in the axial direction of said projection optical system, based on said third amount of defocus and said average of the offsets; and an exposure step for exposing said first shot area to said mask pattern.

34. A method of projection exposure according to claim 33, wherein the measuring point of said first amount of defocus is the center of said sample area, and the measuring point of said third amount of defocus is the center of the first shot area.

35. A method of projection exposure according to claim 33, wherein:

said first detection step further detects, by said focus detection mechanism, amounts of defocus at four corners of each of said sample areas;

said first calculation step further calculates the average of inclination angle of said substrate with reference to the focal plane of said projection optical system, based on the amounts of defocus at the four corners of each of said sample areas; and said method of projection exposure further comprises an inclination correcting step for correcting the inclination angle of said substrate, based on said average of the inclination angle.

36. A method of projection exposure of a substrate to a mask pattern, comprising:

a first detection step for moving a substrate stage supporting the substrate in a plane perpendicular to the optical axis of a projection optical system and detecting, by a focus detection mechanism, in each of sample areas of a certain number preselected from plural shot areas on said substrate, a first amount of defocus which is the amount of difference, in the axial direction of said projection optical system, between the exposed surface of said sample area at a predetermined measuring point therein and the focal plane of said projection optical system;

a position detection step for detecting the coordinate position of each of said sample areas on the coordinate system of said substrate stage;

a second detection step for scanning said substrate by moving an XY-stage movable in a plane perpendicular to the optical axis of said projection optical system and detecting, by said focus detection mechanism, the distribution of the amount of defocus on a measuring line which passes a surface selected within the shot area by a blind for selecting the predetermined mask pattern to be projected, thereby detecting, in each of said sample areas, a second amount of defocus corresponding to said selected area;

a first calculation step for calculating the coordinates of said plural shot areas, based on the coordinate position of each of said sample areas;

a second calculation step for determining the average of the offsets which are the differences between the first and second amounts of defocus in all said sample areas, based on the first and second amounts of defocus in each of said sample areas;

a first movement step for moving said substrate stage to a first shot area among said plural shot areas, based on the result of calculation of said second calculation step;

a third detection step for detecting, by said focus detection mechanism, a third amount of defocus which is the amount of difference, in the axial direction of said projection optical system, between the focal plane of said projection optical system at a predetermined measuring point and the exposed surface of said first shot area;

a second movement step for moving said substrate stage in the axial direction of said projection optical system, based on said third amount of defocus and said average of the offsets; and an exposure step for exposing said first shot area to said mask pattern.

37. A method of projection exposure according to claim 36, wherein said second detection step effects scanning while the movement of said substrate stage in the axial direction of said projection optical system is fixed.

38. A method of projection exposure according to claim 36, wherein the measuring point of said first amount of defocus is the center of said sample area, and the measuring point of said third amount of defocus is the center of the first shot area.

39. A method of projection exposure according to claim 36, wherein:

said first detection step further detects, by said focus detection mechanism, amounts of defocus at four corners of each of said sample areas;

said first calculation step further calculates the average of inclination angle of said substrate with reference to the focal plane of said projection optical system, based on the amounts of defocus at the four corners of each os said sample areas; and said method of projection exposure further comprises an inclination correcting step for correcting the inclination angle of said substrate, based on said average of the inclination angle.

* * * * *

UNITED STATES PATENT AND TRADEMARK OFFICE
CERTIFICATE OF CORRECTION

PATENT NO.   : 5,483,056
DATED        : January 9, 1996
INVENTOR(S)  : Yuji Imai It is certified that error appears in the above-indentified patent and that said Letters Patent is hereby corrected as shown below:

Title page, item [54] and col. 1, line 1 , "PROJECTING" should be -- PROJECTION __ .

Signed and Sealed this

Fourth Day of June, 1996

*Attest:*

BRUCE LEHMAN

*Attesting Officer*            *Commissioner of Patents and Trademarks*